United States Patent
Sharan et al.

(10) Patent No.: US 7,265,032 B2
(45) Date of Patent: Sep. 4, 2007

(54) PROTECTIVE LAYER DURING SCRIBING

(75) Inventors: Sujit Sharan, Chandler, AZ (US); Thomas J. Debonis, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/676,303

(22) Filed: Sep. 30, 2003

(65) Prior Publication Data

US 2005/0070095 A1 Mar. 31, 2005

(51) Int. Cl.
*H01L 21/00* (2006.01)
*H01L 23/544* (2006.01)
(52) U.S. Cl. ............ 438/460; 438/33; 438/68; 438/113; 438/114; 438/458; 438/462; 438/465; 257/620
(58) Field of Classification Search ........ 438/113–116, 438/464; 257/778
See application file for complete search history.

(56) References Cited

U.S. PATENT DOCUMENTS

| | | | |
|---|---|---|---|
| 3,615,951 A * | 10/1971 | Franco et al. ............... | 216/17 |
| 4,842,662 A * | 6/1989 | Jacobi ....................... | 228/110.1 |
| 5,286,343 A | 2/1994 | Hui | |
| 5,543,365 A | 8/1996 | Wills et al. | |
| 5,597,767 A * | 1/1997 | Mignardi et al. .......... | 438/14 |
| 5,641,416 A | 6/1997 | Chadha | |
| 6,465,329 B1 * | 10/2002 | Glenn ........................ | 438/462 |
| 6,506,681 B2 * | 1/2003 | Grigg et al. ............... | 438/693 |
| 6,777,250 B1 * | 8/2004 | Nakajyo et al. ............ | 438/14 |
| 6,838,299 B2 * | 1/2005 | Mulligan et al. ........... | 438/33 |
| 2002/0031899 A1 * | 3/2002 | Manor ....................... | 438/460 |
| 2003/0013233 A1 * | 1/2003 | Shibata ...................... | 438/114 |
| 2004/0014253 A1 * | 1/2004 | Gupta et al. ............... | 438/48 |
| 2004/0110010 A1 * | 6/2004 | Buchwalter et al. ........ | 428/413 |
| 2004/0112880 A1 | 6/2004 | Sekiya | |

(Continued)

FOREIGN PATENT DOCUMENTS

EP 0818818 1/1998

(Continued)

OTHER PUBLICATIONS

H.S. Lehman, et al., "Insulating Lateral Surfaces on Semiconductor Chips," IBM Technical Disclosure Bulletin, vol. 7, No. 12, May 1965, 2 pages.

*Primary Examiner*—Carl Whitehead, Jr.
*Assistant Examiner*—J. D. Mitchell
(74) *Attorney, Agent, or Firm*—Blakely, Sokoloff, Taylor & Zafman LLP

(57) ABSTRACT

A method including forming a chemically soluble coating on a plurality exposed contacts on a surface of a circuit substrate; scribing the surface of the substrate along scribe areas; and after scribing, removing a portion of the coating. A method including forming a circuit structure comprises a plurality of exposed contacts on a surface, a location of the exposed contacts defined by a plurality of scribe streets; forming a coating comprising a chemically soluble material on the exposed contacts; scribing the surface of the substrate along the scribe streets; and after scribing, removing the coating. A method including coating a surface of a circuit substrate comprising a plurality of exposed contacts with a chemically soluble material; scribing the surface of the substrate along scribe areas; removing the coating; and sawing the substrate in the scribe areas.

12 Claims, 3 Drawing Sheets

U.S. PATENT DOCUMENTS

2004/0121514 A1* 6/2004 Yoo et al. .................. 438/106
2004/0188400 A1* 9/2004 Peng et al. ............ 219/121.72

FOREIGN PATENT DOCUMENTS

| JP | 04067650 | | 3/1992 |
| JP | 05211381 | | 8/1993 |
| JP | 2000-630747 | * | 8/2000 |
| JP | 2002055219 | | 8/2000 |

* cited by examiner

PROTECTIVE LAYER DURING SCRIBING

BACKGROUND

1. Field
Circuit Fabrication.

2. Background

The scribe process is used to scribe a circuit substrate (e.g., wafer) prior to sawing the substrate into individual chip or die. According to current technology, a scribe process often uses an ultraviolet laser (typically a yttrium aluminum garnet (YAG) laser) to scribe the substrate prior to a sawing operation. By scribing the substrate prior to sawing, a saw process that saws or cuts through the scribe area to divide or singulate the substrate can generally do so without damaging films (typically dielectric films) on the substrate. During a scribe process, the scribe is created in designated areas or streets by ablating any metal layers or dielectric layers (e.g., low dielectric constant dielectric layers) to the substrate (e.g., a silicon substrate). A laser scribe process typically generates ablated material (mostly silicon with some carbon) as debris. This debris tends to fall on the surface of the substrate. The surface of a substrate generally has a number of exposed contacts (e.g., bump contacts) on its surface. Thus, the debris tends to fall on the contacts and can adhere to the contact surface. This contamination of the contact surface inhibits the contacts from joining subsequent contacts during packaging leading to a characterization referred to as non-wet defects.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
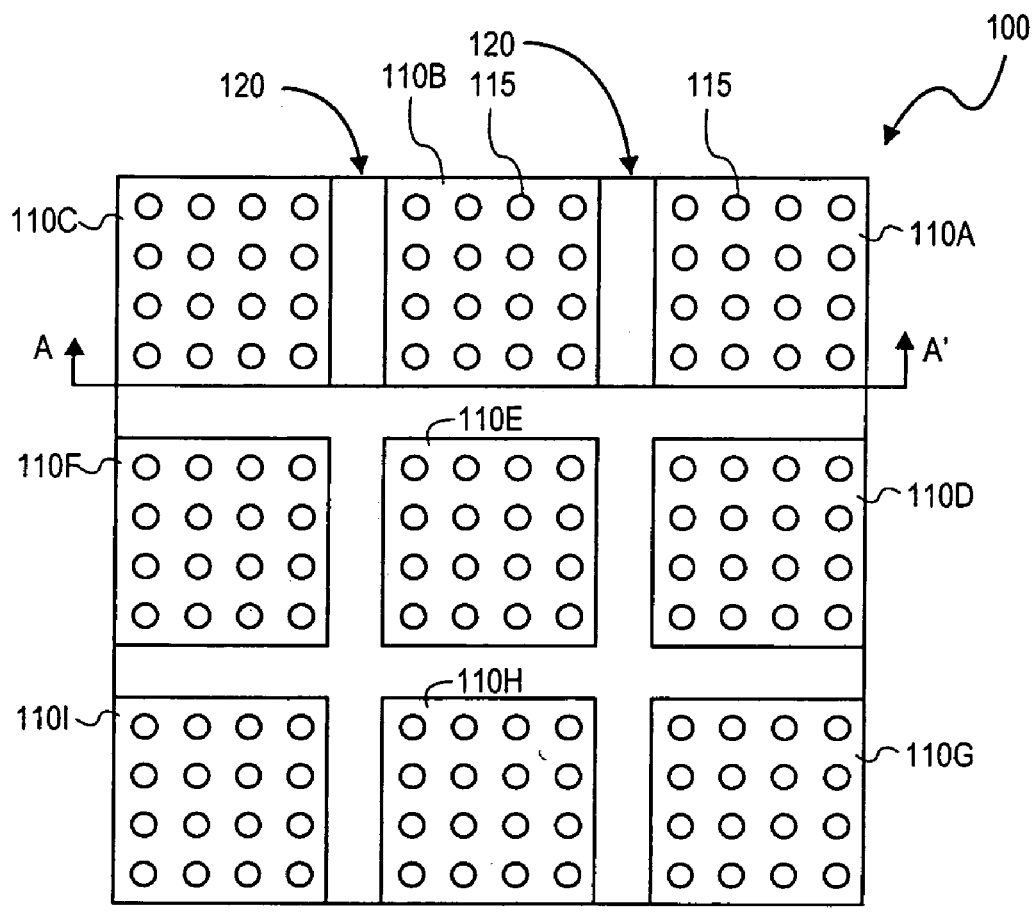
FIG. 1 shows a top side view of a portion of a wafer having a number of discrete circuit structures formed thereon separated by scribe streets.
Figure 2:
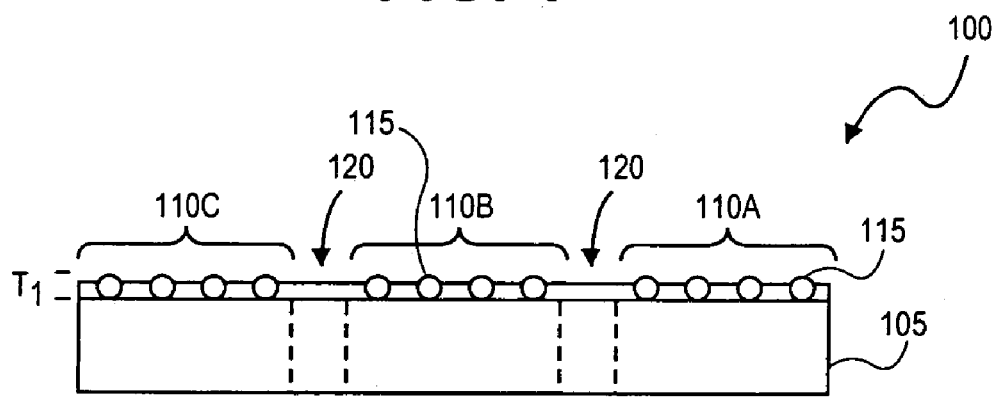
FIG. 2 shows a cross-sectional side portion of the structure of FIG. 1 through line A-A'.

FIG. 1 is a schematic top side view of a portion of a substrate such as a wafer with number of discrete circuit structures formed therein and thereon. FIG. 2 is a cross-sectional side view of the structure of FIG. 1 through line A-A'. Referring to FIG. 1 and FIG. 2, structure 100 includes substrate 105 of, for example, a semiconductor material such as silicon or a semiconductor layer on an insulator such as glass. Structure 100 is a portion of a structure at a wafer level with a number of circuit structures (dies or chips) discreetly represented and connected at this point. Each circuit structure (e.g., die or chip 110A, . . . 110I) is separated on substrate 105 by scribe streets 120 that are used as a singulation area to separate the circuit structures from the substrate into a discrete die or chip. FIG. 1 shows dies or chips 110A, 110B, 110C, 110D, 110E, 110F, 110G, 110H, and 110I (see FIG. 1). Each circuit structure (e.g., die or chip 110A, . . . 110I) may have a number of circuit devices formed in and on substrate 105 and one or more interconnection layers formed above substrate 105 and connecting with the devices on a respective die or chip. A top surface of each circuit structure may have a number of contact points including, in this example, solder or similar conductive material bumps to send or receive signals external to the die or chip. Bumps 115 protrude from a surface of a respective die or chip and, as viewed in FIG. 2, are exposed on the surface of the respective die or chip. As shown in FIG. 2, each bump protrudes from a surface of the substrate, a height, $T_1$, of, on the order of 75 microns. Each bump 115 may be surrounded by a dielectric material that otherwise covers the surface of substrate 105.

Figure 3A:
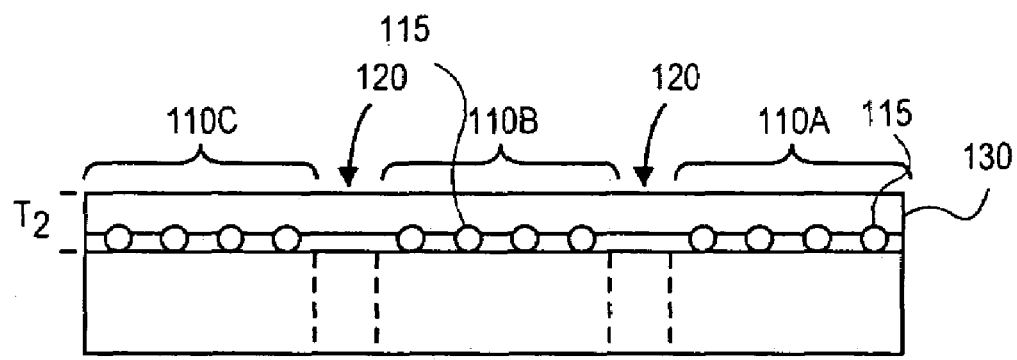
FIG. 3A shows the structure of FIG. 2 following the introduction of a chemically soluble coating on a surface of the structure according to one embodiment.
Figure 3B:
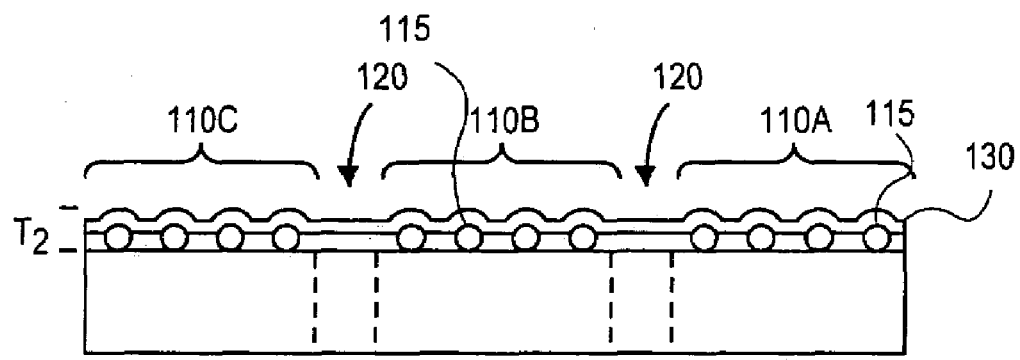
FIG. 3B shows the structure of FIG. 2 following the introduction of a chemically soluble coating on a surface of the structure according to another embodiment.

FIG. 3A shows the structure of FIG. 2 following the introduction of a chemically soluble coating on a surface of structure 100. Chemically soluble coating 130 is deposited, in one embodiment, to a thickness, $T_2$, that is greater than a height, $T_1$, of protrusion of bumps 115 from a surface of the substrate. In this manner, chemically soluble coating 130 overlies (as viewed) bumps 115. In another embodiment, shown in FIG. 3B, chemically soluble coating 130 is deposited as a relatively conformal coating, conforming to the surface of structure 100 and overlying bumps 115. A representative thickness of chemically soluble coating 130 is on the order of five to 35 microns (µm) and, in this embodiment, is thick enough to overlie bumps 115 but not too thick that chemically soluble coating 130 may be not be subsequently removed in a reasonable time. Chemically soluble coating 130, as viewed, overlies each circuit structure of structure 100 as well as scribe streets 120.

In one embodiment, a material of chemically soluble coating 130 is a material that may be subsequently removed from the substrate surface. Where an ultraviolet laser scribe process will be used to scribe structure 100, a material for chemically soluble coating 130 should also be transparent to ultraviolet light so that it does not inhibit a subsequent scribe process (e.g., a YAG laser scribe process). Finally, in one embodiment, a material for chemically soluble coating 130 is environmentally non-toxic or harmful so that additional cautionary measures need not be taken during removal. Suitable materials for chemically soluble coating 130 include organic coatings, including hydrophillic coatings, such as methyl cellulose, polyvinyl alcohol, and resin flux. These materials are transparent to ultraviolet light, may be removed with water, and are environmentally non-toxic or harmful. In one embodiment, chemically soluble coating 130 of a material such as methyl cellulose, polyvinyl alcohol, or resin flux may be applied to the substrate surface by various coating techniques, including, but not limited to, spinning, electrostatic spraying, or other techniques.

Figure 4:
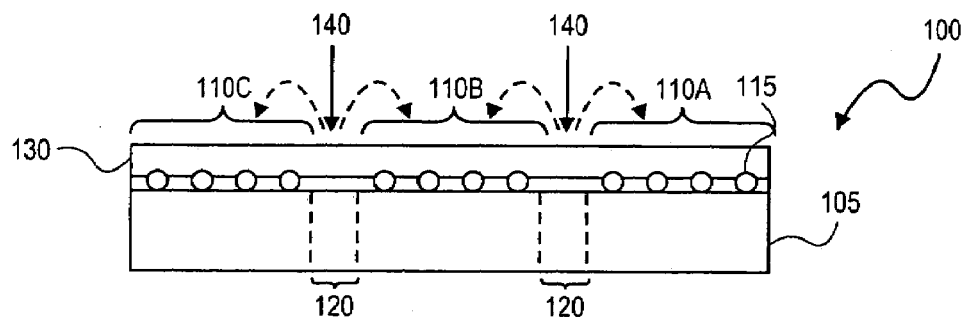
FIG. 4 shows the structure of FIG. 3A and a scribe process.

FIG. 4 shows the structure of FIG. 3A and illustrates a scribe process in scribe streets 120. In one embodiment, a laser scribe process is utilized in which a YAG laser is used to scribe substrate 105. The scribing process tends to generate debris, mostly silicon and carbon, that, as the substrate is ablated, falls on chemically soluble coating 130.

Figure 5:
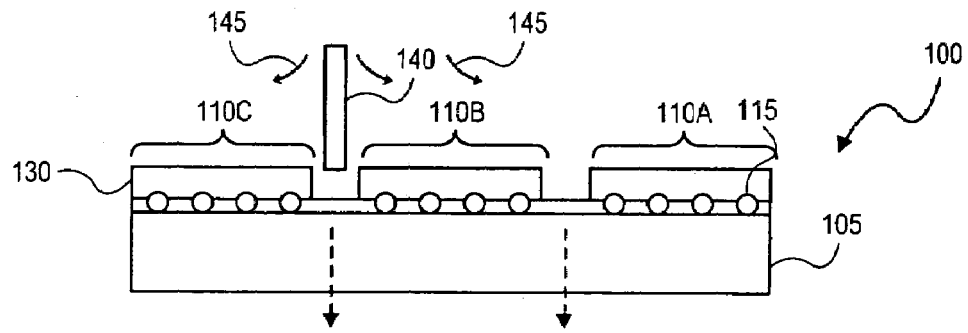
FIG. 5 shows the structure of FIG. 4 during a wet sawing process.

FIG. 5 shows the structure of FIG. 4 and illustrates a sawing process. In one embodiment, the sawing process utilizes saw 140 and water 145 (a wet sawing process). Saw 140 cuts through substrate 105 to singulate circuit structures (e.g., dies or chips 110A, . . . 110I). Where chemically soluble coating is water soluble, in one embodiment, the water utilized during the sawing process may serve also to remove the material of chemically soluble coating 130. Alternatively, chemically soluble coating 130 may be removed, such as by rinsing with water or other solvent, prior to or after the sawing process.

Figure 6:
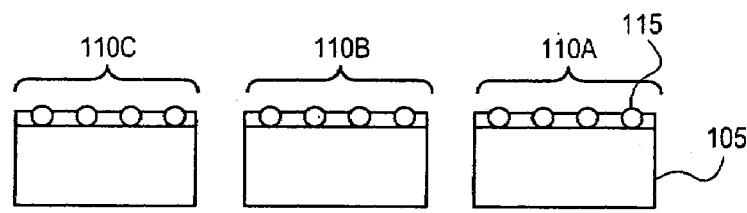
FIG. 6 shows the structure of FIG. 5 following the wet sawing process.

FIG. 6 shows the structure of FIG. 5 following the singulation of individual circuit structures. Illustrated in FIG. 6 are die or chip 110A, die or chip 110B, and die or chip 110C. FIG. 6 also shows each circuit structure after the removal of chemically soluble coating 130. In this manner, contacts (bumps) 115 are exposed. Any debris that was generated process, during the scribing process, has been removed with the removal of chemical soluble coating 130.

Figure 7:
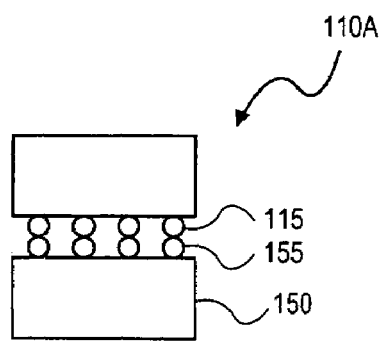
FIG. 7 shows a side view of a die or chip connected to a package.

FIG. 7 shows die or chip 110A mounted on package 150. In this embodiment, the mounting method includes contacting bumps 115 of die or chip 110A with corresponding contact points or bumps 155 of package 150. Once the contact between the contact points is made, a reflow process may be used to join die or chip 110A to package 150. By utilizing chemically soluble coating 130 during the scribing process, the ability of ablated material to land on contact points or bumps 115 is minimized. Accordingly, the possibility of defects occurring when a die or chip is connected, for example, to a package, is minimized (e.g., the number of non-wets is minimized).

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. A method comprising:
    forming a chemically soluble coating on a plurality of exposed contacts on a surface of a circuit substrate and on the surface to a thickness greater than a distance of surface protrusion of a portion of the plurality of contacts; then
    scribing through the substrate along scribe areas, wherein scribing comprises using a laser and generating debris on the coating; and
    after scribing, removing the coating by a dissolution process to remove the debris, and to expose the plurality of contacts and the surface and sawing with a saw, completely through the substrate along the scribed areas prior to or simultaneous with removing the coating.

2. The method of claim 1, wherein each of a portion of the plurality of contacts comprise protruding bumps on the surface.

3. The method of claim 2, wherein the coating has a thickness of 5 to 35microns.

4. The method of claim 1, wherein sawing and removing a the coating are done simultaneously.

5. The method of claim 1, wherein a material of the chemically soluble coating is selected from the group consisting of methyl cellulose, polyvinyl alcohol, and resin flux.

6. The method of claim 1, wherein a material of the coating is an organic coating.

7. The method of claim 1, wherein sawing comprises sawing with a saw, completely through the substrate along the scribed areas prior to removing the coating.

8. A method comprising:
    forming a circuit structure comprising a plurality of exposed contacts on a surface, a location of the exposed contacts defined by a plurality of scribe streets;
    forming a coating comprising a chemically soluble material on the exposed contacts and on the surface to a thickness on the surface that is greater than a distance of surface protrusion of a portion of the plurality of contacts; then
    scribing through the substrate along the scribe streets using a laser; and
    after scribing, removing the coating from an area on the contacts and removing the coating thickness from the surface by a water dissolution process and sawing with a saw, completely through the substrate along the scribed streets prior to or simultaneous with removing the coating.

9. The method of claim 8, wherein sawing and removing the coating are done simultaneously.

10. The method of claim 8, wherein removing the coating comprises removing the entire coating.

11. The method of claim 8, wherein the material of the coating is selected from the group consisting of methyl cellulose, polyvinyl alcohol, and resin flux.

12. A method comprising:
    coating a surface of a circuit substrate comprising a plurality of exposed contacts with a chemically soluble material; then
    scribing the surface of the substrate along scribe areas, wherein scribing comprises using a laser and generating debris on the coating;
    removing the coating to remove the debris, and to expose the plurality of contacts by removing all of the coating during a dissolution process; and
    sawing completely the substrate in the scribe areas, wherein sawing is done using a saw, one of prior to and simultaneously with removing the coating.

* * * * *